United States Patent
Noh et al.

(10) Patent No.: US 7,799,639 B2
(45) Date of Patent: Sep. 21, 2010

(54) METHODS OF FABRICATING NON-VOLATILE MEMORY DEVICES INCLUDING A CHLORINE CURED TUNNEL OXIDE LAYER

(75) Inventors: Young-jin Noh, Gyeonggi-do (KR); Si-Young Choi, Gyeonggi-do (KR); Bon-young Koo, Gyeonggi-do (KR); Ki-hyun Hwang, Gyeonggi-do (KR); Chul-sung Kim, Gyeonggi-do (KR); Sung-kweon Baek, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 60 days.

(21) Appl. No.: 12/123,919

(22) Filed: May 20, 2008

(65) Prior Publication Data

US 2008/0299755 A1 Dec. 4, 2008

(30) Foreign Application Priority Data

Jun. 1, 2007 (KR) .................... 10-2007-0053952

(51) Int. Cl.
*H01L 21/336* (2006.01)

(52) U.S. Cl. ............... 438/265; 438/774; 257/E21.625; 257/E21.639

(58) Field of Classification Search ................. 438/774, 438/265; 257/E21.625, E21.621, E21.639, 257/E21.623, E21.635
See application file for complete search history.

(56) References Cited

U.S. PATENT DOCUMENTS 6,114,257 A * 9/2000 Ronsheim .................... 438/779
6,660,587 B2 * 12/2003 Ahn et al. .................... 438/257
7,101,803 B2   9/2006 Lee et al.

FOREIGN PATENT DOCUMENTS

| JP | 11-103033 A | 4/1999 |
| KR | 2003-0057878 A | 7/2003 |
| KR | 10-2005-0057793 A | 6/2005 |
| KR | 10-0497603 B1 | 6/2005 |

* cited by examiner

*Primary Examiner*—Caridad M Everhart
(74) *Attorney, Agent, or Firm*—Myers Bigel Sibley & Sajovec, P.A.

(57) ABSTRACT

Fabrication of a nonvolatile memory device includes sequentially forming a tunnel oxide layer, a first conductive layer, and a nitride layer on a semiconductor substrate. A stacked pattern is formed from the tunnel oxide layer, the first conductive layer, and the nitride layer and a trench is formed in the semiconductor substrate adjacent to the stacked pattern. An oxidation process is performed to form a sidewall oxide layer on a sidewall of the trench and the first conductive layer. Chlorine is introduced into at least a portion of the stacked pattern subjected to the oxidation process. Introducing Cl into the stacked pattern may at least partially cure defects that are caused therein during fabrication of the structure.

17 Claims, 4 Drawing Sheets

METHODS OF FABRICATING NON-VOLATILE MEMORY DEVICES INCLUDING A CHLORINE CURED TUNNEL OXIDE LAYER

CROSS-REFERENCE TO RELATED PATENT APPLICATION

This application claims the benefit of Korean Patent Application No. 10-2007-0053952, filed on Jun. 1, 2007, in the Korean Intellectual Property Office, the disclosure of which is incorporated herein in its entirety by reference.

BACKGROUND OF THE INVENTION

1. Field of the Invention

The present invention relates to methods of fabricating semiconductor devices, and more particularly, to methods of curing a tunnel oxide layer of a nonvolatile memory device.

2. Description of the Related Art

Nonvolatile memory devices are memory devices capable of retaining data when the supply of power thereto is stopped. Example nonvolatile memory devices include flash memory which is widely used in mobile communication terminals and portable data storage devices. The demand for nonvolatile memory devices has increased dramatically, which has caused nonvolatile memory devices to play an important role in the memory markets.

Flash memory devices are capable of being programmed in cell units and erased in block units or sector units. To program, erase, or read data in a flash memory, charges are injected into a floating gate of a memory cell transistor to obtain a high threshold voltage or charges are released from the floating gate of the memory cell transistor to obtain a low threshold voltage. When program/erasing operations are performed, the charges are injected into the floating gate or released from the floating gate through a tunnel oxide layer. Therefore, the operational reliability of the flash memory can be highly influenced by the electrical properties of the tunnel oxide layer.

The electrical properties of the tunnel oxide layer may be improved during fabrication using various growth and subsequent thermal treatment processes. However, subsequent processes, such as dry etching and washing, can deteriorate the properties of the tunnel oxide layer and, thereby, deteriorate the reliability of the memory device. One process that can deteriorate the properties of the tunnel oxide layer is a trench etching process.

As semiconductor devices become smaller, a self-aligned trench isolation structure for simultaneously patterning a floating gate and a trench isolation layer has typically been used. The self-aligned trench isolation structure has the advantage of decreasing the number of processes, and may thereby improve the reliability of the gate oxide layer and decrease the associated distribution of a threshold voltage in a cell array.

However, through the trench etching process, edge regions of the tunnel oxide layer exposed by a trench may be easily damaged due to plasma etching compared to a center region of the tunnel oxide layer. For example, plasma ions generated during gate etching may be deposited on the edge regions of the tunnel oxide layer, and unstable bonds, such as Si—O and Si—H, which are strained by damage due to the etching, may increase at the edges of the tunnel oxide layer. Such defects function as traps of electrons or holes during data programming or erasing operations of a nonvolatile memory device, and thus may deteriorate the reliability of the nonvolatile memory device.

In an attempt to cure the defects of the tunnel oxide layer, in general, a sidewall oxidation process may be subsequently performed after performing the trench etching process. The sidewall oxidation process is typically a radical oxidation process that uses $O_2$ or $H_2$. During a radical oxidation process, enough sidewall oxidation should be performed to attempt to remove defect bonds at the edges of the tunnel oxide layer and to cure damage due to the trench etching. However, as the size of the devices becomes smaller with increasing numbers of targets for the sidewall oxidation, the reliability improvement of the device using a radical oxidation process can be limited due, for example, to punch through occurring in the tunnel oxide layer.

SUMMARY OF THE INVENTION

Various embodiments of the present invention are directed to at least partially curing defects that are generated in edge portions of a tunnel oxide layer during fabrication of a gate electrode and a trench in a nonvolatile memory device.

Some embodiments of the present invention are directed to a method of fabricating a nonvolatile memory device. A tunnel oxide layer, a first conductive layer, and a nitride layer are sequentially formed on a semiconductor substrate. A stacked pattern is formed from the tunnel oxide layer, the first conductive layer, and the nitride layer and a trench is formed in the semiconductor substrate adjacent to the stacked pattern. An oxidation process is performed to form a sidewall oxide layer on a sidewall of the trench and the first conductive layer. Chlorine is introduced into at least a portion of the stacked pattern subjected to the oxidation process.

In some further embodiments, Cl is introduced into an edge region of the tunnel oxide layer. The Cl introduced into the edge region of the tunnel oxide layer can form Si—Cl bond sites which function as trap sites for electrons/holes generated in the tunnel oxide layer during the formation of the stacked pattern. A sufficient amount of Cl can be introduced into the edge region of the tunnel oxide layer to substantially reduce loss of electrons from the first conductive layer through the edge region of the tunnel oxide layer during operation of the memory device. The Cl can be further introduced into the sidewall oxide layer to form a modified sidewall oxide layer.

In some further embodiments, the Cl is introduced by reoxidizing the stacked pattern in an atmosphere containing oxygen and a Cl source. The tunnel oxide layer can be formed using a thermal oxidation process and/or a CVD process. The first conductive layer can be formed of a material including polycrystalline silicon containing N type or P type impurities.

In some further embodiments, the thermal treatment that forms the sidewall oxide layer is performed using a radical oxidation process. The radical oxidation process can be performed in a temperature range of about 800 to 1050° C. The Cl can be introduced by reoxidizing the stacked pattern in an atmosphere containing oxygen and a Cl source, and the reoxidation can be performed in-situ in a chamber used to perform the thermal treatment and uses a radical oxidation process.

In some further embodiments, the thermal treatment that forms the sidewall oxide layer is performed using a plasma oxidation process. The plasma oxidation process can be performed in a temperature range of about 200 to 900° C. The Cl can be introduced by reoxidizing the stacked pattern in an atmosphere containing oxygen and a Cl source, and the reoxidation can be performed in-situ in a chamber used to perform the thermal treatment and can use a plasma oxidation process.

In some further embodiments, the Cl is introduced by reoxidizing the stacked pattern in an atmosphere containing oxygen and a Cl source containing HCl.

In some further embodiments, the pad oxide layer is formed as a moderate temperature oxide (MTO) layer.

BRIEF DESCRIPTION OF THE DRAWINGS

The above and other features of the present invention will become more apparent by the following description of exemplary embodiments thereof with reference to the attached drawings in which.

DETAILED DESCRIPTION OF EMBODIMENTS OF THE INVENTION

Figure 1A:
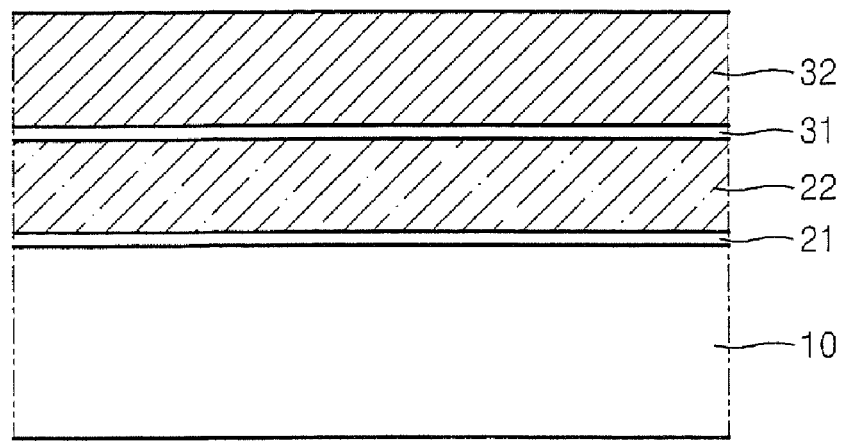
FIG. 1A through FIG. 1F are cross-sectional views sequentially illustrating methods of fabricating a flash memory device according to some embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses sizes of layers and regions are exaggerated for clarity. Like reference numerals in the drawings denote like elements. A semiconductor substrate described in the present specification denotes not only the semiconductor substrate itself, but also a structure in/on which the semiconductor substrate is formed by various processes.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1A through FIG. 1F are cross-sectional views sequentially illustrating methods of fabricating a flash memory device according to some embodiments of the present invention. It is to be understood that the present invention is not limited to use in fabrication of the exemplary flash memory device, but instead can be applied for fabrication of other types of nonvolatile memory devices.

First, referring to FIG. 1A, a tunnel oxide layer 21, a first conductive layer 22, a pad oxide layer 31, and a nitride layer 32 are formed on a semiconductor substrate 10. The tunnel oxide layer 21 may be formed by using a thermal oxidation process and/or a chemical vapor deposition (CVD) process. The first conductive layer 22 may be formed by a CVD process. The first conductive layer 22 may correspond to a floating gate electrode and may include polycrystalline silicon containing N type or P type conductivity impurities. N type or P type conductivity impurities may be introduced by a doping process after forming the first conductive layer 22 and/or by doping in-situ while the first conductive layer 22 is formed. The pad oxide layer 31 can be configured to reduce/avoid stress that may otherwise be generated when the nitride layer 32 is formed directly on the first conductive layer 22. The pad oxide layer 31 may be made of, for example, moderate temperature oxide (MTO). The nitride layer 32 may be formed by a CVD process, and may function as a patterning mask in a subsequent etching process and/or as a polishing end layer in a chemical mechanical polishing (CMP) process.

Figure 1B:
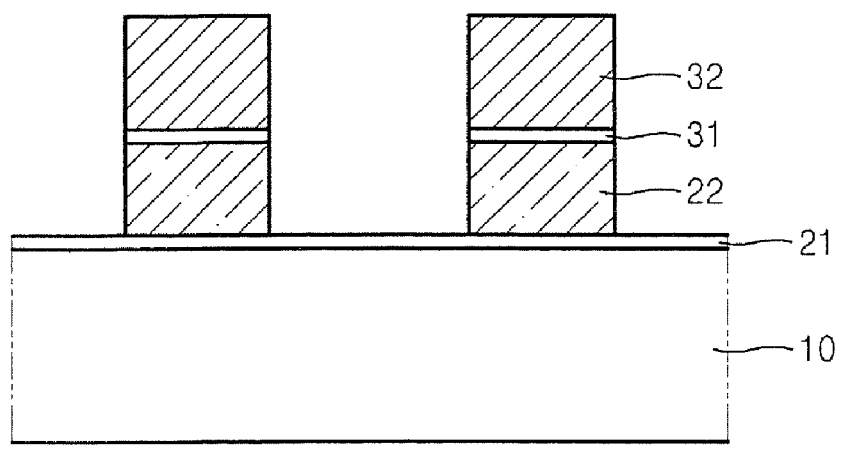

Referring to FIG. 1B, the nitride layer 32, the pad oxide layer 31, the first conductive layer 22, and the tunnel oxide layer 21 are patterned by a photo etching process. The patterned first conductive layer 22 is configured to function as a floating gate. After forming patterns of the nitride layer 32 and the pad oxide layer 31 by using a photoresist pattern (not shown) as a mask, the pattern of the first conductive layer 22 may be formed by etching the first conductive layer 22 and the tunnel oxide layer 21 using the patterns of the nitride layer 32 and the pad oxide layer 31 as masks.

Figure 1C:
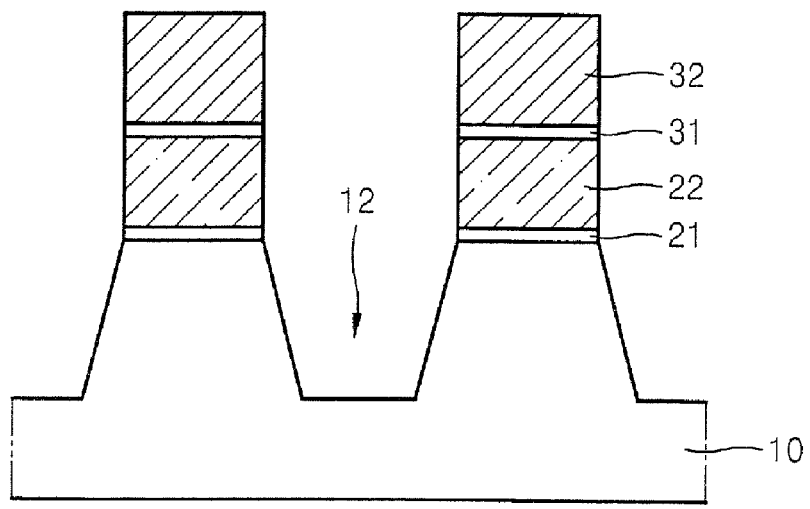

Referring to FIG. 1C, a trench 12 for element isolation is formed by etching the semiconductor substrate 10 while using a stacked pattern, which includes the nitride layer 32, the pad oxide layer 31, the first conductive layer 22, and the tunnel oxide layer 21, as a mask. The trench 12 defines an active region in the substrate 10 and may be formed using the stacked pattern as a self aligned mask without using a separately formed mask. Accordingly, with reference to FIG. 1B and FIG. 1C, the nitride layer 32 can be patterned and then the lower layers can each be sequentially patterned while using the patterned upper layer as a mask, and continuing the patterning until the trench 12 is formed.

Figure 1D:
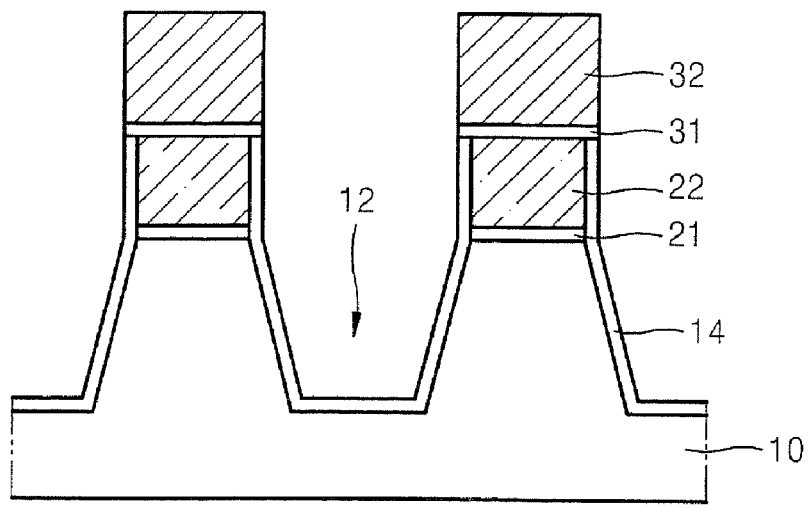

Referring to FIG. 1D, after forming the trench 12, a sidewall oxide layer 14 is formed on sidewalls of the first conductive layer 22 and the trench 12. The sidewall oxide layer 14 is formed so as to at least partially cure defects generated in the first conductive layer 22, the tunnel oxide layer 21, and the trench 12 which may be caused by plasma during etching of the first conductive layer 22 and the trench 12. The sidewall oxide layer 14 can be formed using a radical oxidation process, a plasma oxidation process, and/or a thermal oxidation process.

For example, the plasma oxidation process may use $H_2$ or $O_2$ as a source gas, and may be performed in a pressure range of about 1 mT-10 T at a temperature range of about 250-900° C. In the radical oxidation process, $N_2O$, $O_3$, $NO_2$ or a combination gas thereof may be used as a source gas, and oxygen radical such as $O^*$ or $OH^*$ may be formed using UV irradiation, electron beam irradiation, micro wave stimulation, and/or plasma. The radical oxidation process may be performed in a temperature range of about 800-1050° C. and in a pressure range of about several to several tens of Torr.

Figure 1E:
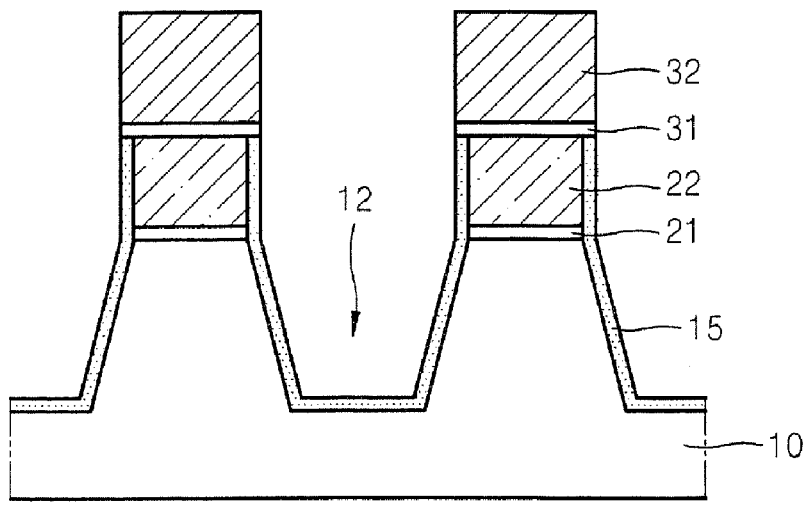

Referring to FIG. 1E, after forming the sidewall oxide layer 14, a reoxidation process is performed in accordance with some embodiments of the present invention. The reoxidation process may be performed in an $O_2$+HCl atmosphere so that Cl (chlorine) is introduced into an edge region of the tunnel oxide layer 21. The reoxidation may be performed in-situ using equipment that was used for the process for forming the sidewall oxide layer 14. For example, when the sidewall oxide layer 14 is formed using equipment that carries out a radical oxidation process and/or a plasma oxidation process, the reoxidation process can also be performed using the same equipment and may be formed using the same or similar processes. The in-situ reoxidation can be performed within, and without breaking pressure lock on, a chamber following the formation of the sidewall oxide layer 14.

The edge regions of the tunnel oxide layer 21 can be damaged when exposed by a plasma during etching of the gate electrode 22 and the trench 12. Associated defects that can be generated in the edge regions of the tunnel oxide layer 21 can include, for example, unstable bonds such as Si—H and/or destruction of silicon-oxygen bonds and/or silicon-silicon bonds. The ability to make the sidewall oxide layer 14 thicker in an attempt to cure those defects is limited as the device features becomes smaller. Such limitation may be avoided by using a reoxidation process that introduces Cl to form a modified sidewall oxide layer 15 with a defined thickness. The reliability of the device may be improved by the reoxidation process forming defect sites for Si—Cl bonds (having a bonding energy of 4.21 eV) into the modified sidewall oxide layer 15, which are more stable than Si—H bonds (having a bonding energy of 3.10 eV). A sufficient amount of Cl may be introduced into the edge region of the tunnel oxide layer 21 to substantially reduce loss of electrons from the gate electrode 22 during operation of the associated cell of the memory device.

Figure 1F:
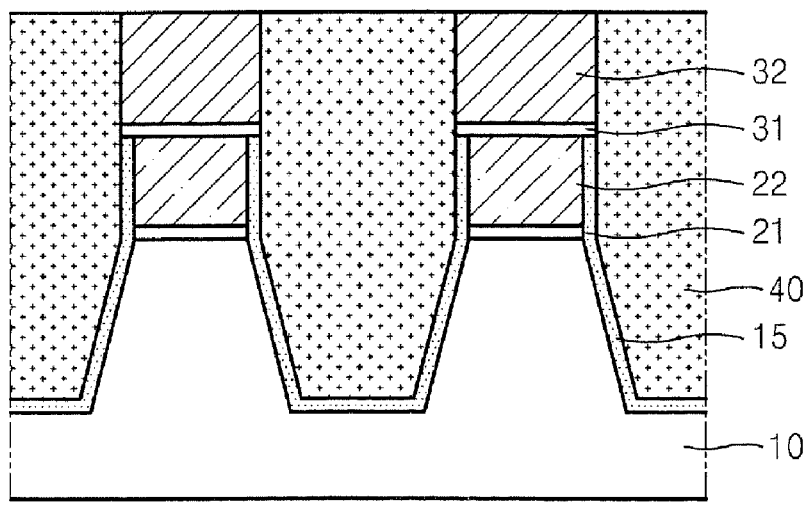

Referring to FIG. 1F, a gap-fill oxide layer is formed that fills the remaining space of trench 12 between the stacked patterns, a CMP process may be performed using the nitride layer 32 as a planarization stop layer to form a device separating layer 40. The gap-fill oxide layer may be made of a USG and/or a HDP oxide layer which has an excellent step coverage.

The nitride layer 32 may be subsequently removed. A dielectric layer between gates and a second conductive layer that functions as a control gate may be formed and patterned to fabricate a gate electrode structure including a tunnel oxide layer, a floating gate/dielectric layer, and a control gate. Source/drain regions are formed to further fabricate the memory cell transistor.

Figure 2:
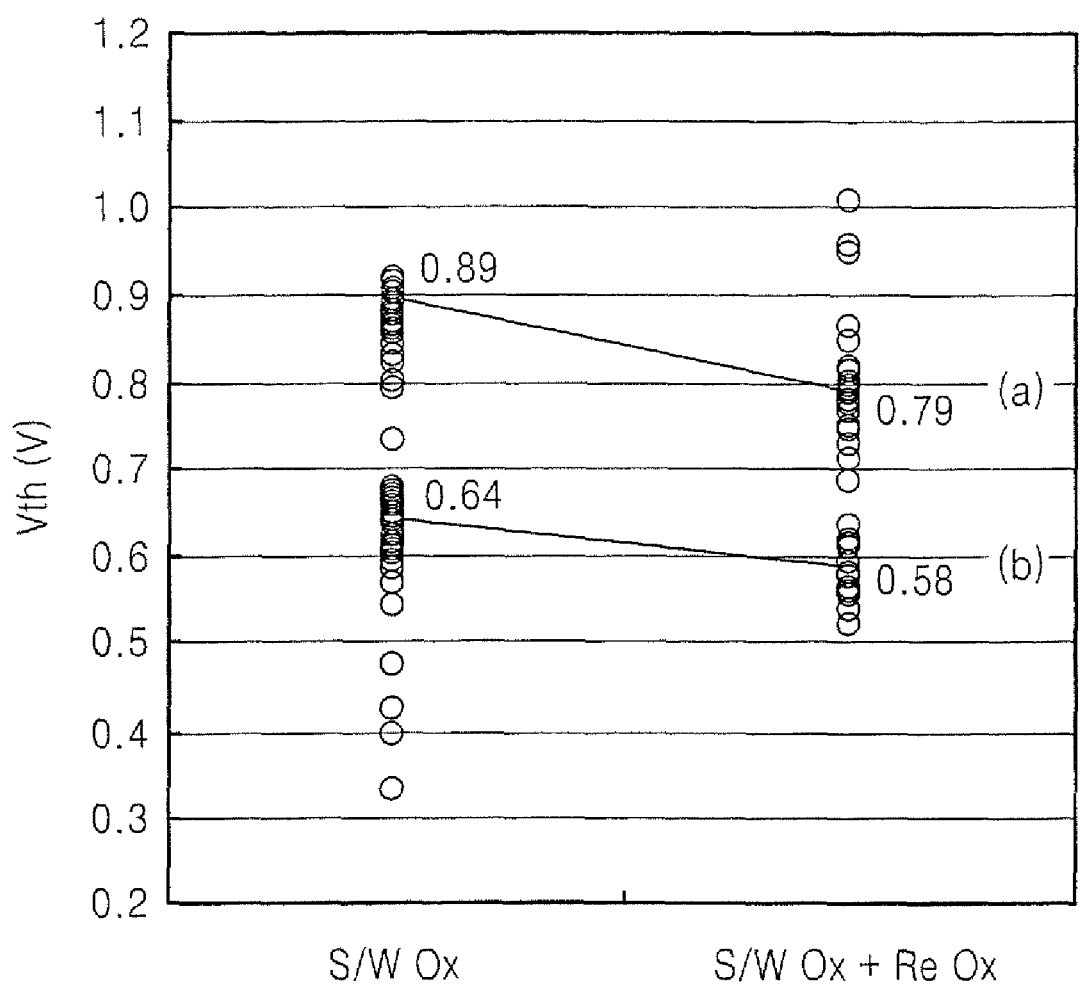
FIG. 2 is a graph illustrating the effect on exemplary threshold voltage (Vth) values from use of a reoxidation process during fabrication of a flash memory device according to some embodiments of the present invention.

FIG. 2 is a graph illustrating the effect on exemplary threshold voltage (Vth) values by a reoxidation process during fabrication of a flash memory device according to some embodiments of the present invention. In FIG. 2, the effect on threshold voltage values that may be obtained when a sidewall oxide layer is formed using a radical oxidation method without a reoxidation process as described above is denoted as S/W Ox. In sharp contrast thereto, the effect on threshold voltage that may be obtained when a sidewall oxide layer is formed using a further reoxidation process that introduces Cl therein using an in-situ radical oxidation process is denoted as S/W Ox+Reox.

In FIG. 2, "(a)" denotes varying values of a threshold voltage which is determined after or before baking for 2 hours at a temperature of 200° C., and "(b)" denotes varying values of a threshold voltage which is determined after program/erasing are performed for 1200 cycles and further after or before baking for 2 hours at a temperature of 200° C. Each of the illustrated circles in FIG. 2 indicates an average value of the varying values of threshold voltages that may be obtained for a 64 Mbit memory.

The threshold voltages can correspond to measurements in a state where a floating gate has been fully charged with electrons. The variations in the threshold voltages can be associated with electrons escaping from the floating gate via the tunnel oxide layer. Accordingly, smaller variations in the threshold voltage values are associated with higher resulting reliability of the memory device.

FIG. 2 shows that forming the sidewall oxide layer and then using in-situ reoxidation, such as described above, may result in a lower variation in the threshold voltage values compared to when the sidewall oxide layer is formed without a subsequent reoxidation in the (a) and (b) conditions described above. Therefore, the loss of the electrons through the tunnel oxide layer can be less when the formation of the sidewall oxide layer and in-situ reoxidation are performed together compared to when reoxidation is not performed. As a result, the reliability of the memory device may be improved by use of the reoxidation process described herein.

According to some embodiments of the present invention, after etching a floating gate electrode and a trench to provide element isolation, a sidewall oxide layer is formed and then a reoxidation process in performed to introduce Cl into an edge region of a tunnel oxide layer. The reoxidation can be performed in-situ without breaking vacuum lock on a chamber following the formation of the sidewall oxide layer. Cl introduced into the edge region of the tunnel oxide layer may substitute defects therein, which function as trap sites for electrons/holes generated in the tunnel oxide layer during the etching process, with an Si—Cl bond having a stable bond energy, and which may reduce or prevent electrons in a floating gate from being lost and may thereby improve the reliability of the memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a nonvolatile memory device, the method comprising:
sequentially forming a tunnel oxide layer, a first conductive layer, and a nitride layer on a semiconductor substrate;
forming a stacked pattern from the tunnel oxide layer, the first conductive layer, and the nitride layer and a trench in the semiconductor substrate adjacent to the stacked pattern;
performing an oxidation process using a radical oxidation process or a plasma oxidation process to form a sidewall oxide layer on a sidewall of the trench and the first conductive layer; and
introducing Cl into at least a portion of the stacked pattern subjected to the oxidation process.

2. The method of claim 1, wherein introducing Cl comprises reoxidizing the stacked pattern in an atmosphere containing oxygen and a Cl source.

3. The method of claim 1, wherein the tunnel oxide layer is formed using a thermal oxidation process and/or a CVD process.

4. The method of claim 1, wherein the first conductive layer is formed of a material comprising polycrystalline silicon containing N type or P type impurities.

5. The method of claim 1, wherein the radical oxidation process is performed in a temperature range of about 800 to 1050° C.

6. The method of claim 1, wherein:
introducing Cl comprises reoxidizing the stacked pattern in an atmosphere containing oxygen and a Cl source; and
the reoxidation is performed in-situ in a chamber used to perform the oxidation process and uses a radical oxidation process.

7. The method of claim 1, wherein the plasma oxidation process is performed in a temperature range of about 200 to 900° C.

8. The method of claim 1, wherein:
introducing Cl comprises reoxidizing the stacked pattern in an atmosphere containing oxygen and a Cl source; and
the reoxidation is performed in-situ in a chamber used to perform the oxidation process and uses a plasma oxidation process.

9. The method of claim 1, wherein:
introducing Cl comprises reoxidizing the stacked pattern in an atmosphere containing oxygen and a Cl source containing HCl.

10. The method of claim 1, wherein the trench is formed self-aligned to the nitride layer.

11. The method of claim 1 further comprising:
forming a gap-fill oxide layer that fills the trench and space between an adjacent pair of the stacked patterns after introducing Cl into at least a portion of the stacked pattern subjected to the oxidation process;
planarizing the gap-fill oxide layer using the nitride layer as a planarization stop layer;
removing the nitride layer;
forming a dielectric layer and a second conductive layer on the conductive layer exposed after removing the nitride layer; and
forming a gate electrode by patterning the second conductive layer and the dielectric layer.

12. The method of claim 1, wherein the Cl is introduced into an edge region of the tunnel oxide layer.

13. The method of claim 12, wherein the Cl is further introduced into the sidewall oxide layer to form a modified sidewall oxide layer.

14. The method of claim 12, wherein the Cl is introduced into the edge region of the tunnel oxide layer to form Si—Cl bond sites which substitute trap sites for electrons/holes generated in the tunnel oxide layer during the formation of the stacked pattern.

15. The method of claim 14, wherein a sufficient amount of Cl is introduced into the edge region of the tunnel oxide layer to substantially reduce loss of electrons from the first conductive layer through the edge region of the tunnel oxide layer during operation of the memory device.

16. The method of claim 1 further comprising:
forming a pad oxide layer between the conductive layer and the nitride layer.

17. The method of claim 16, wherein the pad oxide layer is formed as a moderate temperature oxide (MTO) layer.

* * * * *